US012633937B2

(12) United States Patent
Sawaby et al.

(10) Patent No.: US 12,633,937 B2
(45) Date of Patent: May 19, 2026

(54) OFFSET REDUCTION IN POWER MANAGEMENT SYSTEMS

(71) Applicant: Apple Inc., Cupertino, CA (US)

(72) Inventors: Ahmed M. Sawaby, Sunnyvale, CA (US); Hubert Attah, Santa Clara, CA (US)

(73) Assignee: Apple Inc., Cupertino, CA (US)

(*) Notice: Subject to any disclaimer, the term of this patent is extended or adjusted under 35 U.S.C. 154(b) by 178 days.

(21) Appl. No.: 18/738,828

(22) Filed: Jun. 10, 2024

(65) Prior Publication Data

US 2025/0379589 A1 Dec. 11, 2025

(51) Int. Cl.
H03M 1/38 (2006.01)
H02M 1/00 (2007.01)

(52) U.S. Cl.
CPC ........... H03M 1/38 (2013.01); H02M 1/0012 (2021.05)

(58) Field of Classification Search
CPC .............................. H03M 1/38; H02M 1/0012
USPC .......................................................... 341/161
See application file for complete search history.

(56) References Cited

U.S. PATENT DOCUMENTS

| | | | | |
|---|---|---|---|---|
| 7,855,905 | B2 * | 12/2010 | Leung | H02M 3/157 |
| | | | | 323/284 |
| 10,050,542 | B2 * | 8/2018 | Sandusky | H02M 3/33538 |

| | | | |
|---|---|---|---|
| 2007/0085720 | A1 | 4/2007 | Fosler |
| 2017/0099011 | A1 | 4/2017 | Freeman et al. |
| 2019/0379288 | A1 | 12/2019 | Chaput et al. |
| 2021/0026309 | A1 | 1/2021 | Elkholy |
| 2021/0376844 | A1 | 12/2021 | Wang et al. |
| 2023/0018398 | A1 | 1/2023 | Whitcombe et al. |

FOREIGN PATENT DOCUMENTS

| | | |
|---|---|---|
| CN | 104283563 A | 1/2015 |
| CN | 112825485 A | 5/2021 |
| JP | 2013239951 A | 11/2013 |
| KR | 20140015048 A | 2/2014 |

* cited by examiner

*Primary Examiner* — Khai M Nguyen
(74) *Attorney, Agent, or Firm* — Aikin & Gallant, LLP

(57) ABSTRACT

A switching converter can provide an output voltage for a subsystem. A successive approximation analog to digital converter (ADC) can receive an error input based on a difference between the output voltage and a target voltage for the subsystem. The ADC can utilize a successive approximation register (SAR) and a charge scaling digital to analog converter (DAC) to generate a digital output representing the error input to adjust the switching converter. An offset controller can provide an offset value to the ADC to counter an offset error in the power management system. The ADC can alternate between utilizing the offset value and utilizing an output of the SAR to generate the digital output. Further, a range controller can adjust a voltage range, utilized by the ADC to generate the digital output, based on the error input. Other aspects are also described and claimed.

20 Claims, 6 Drawing Sheets

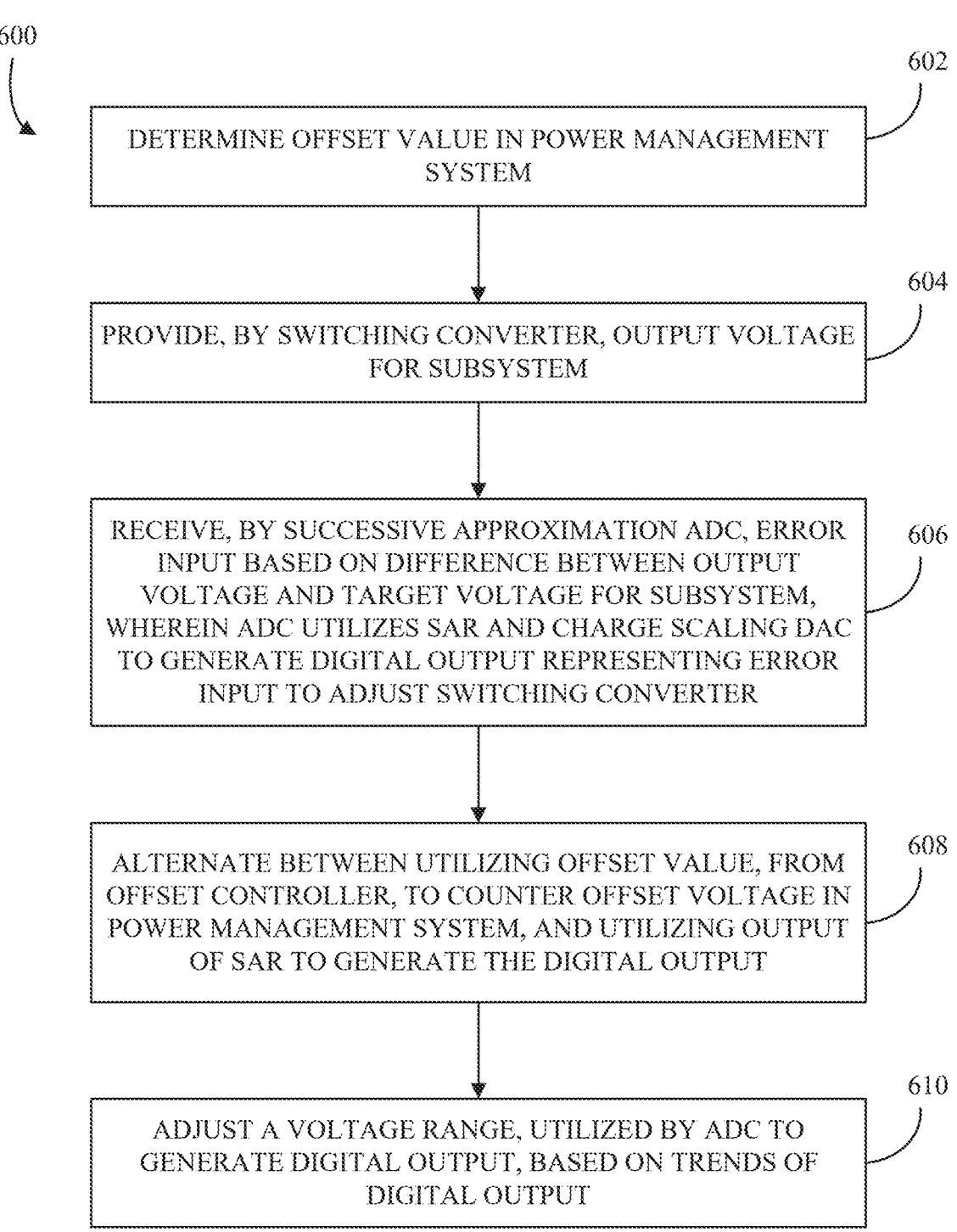

600

602

DETERMINE OFFSET VALUE IN POWER MANAGEMENT SYSTEM

604

PROVIDE, BY SWITCHING CONVERTER, OUTPUT VOLTAGE FOR SUBSYSTEM

606

RECEIVE, BY SUCCESSIVE APPROXIMATION ADC, ERROR INPUT BASED ON DIFFERENCE BETWEEN OUTPUT VOLTAGE AND TARGET VOLTAGE FOR SUBSYSTEM, WHEREIN ADC UTILIZES SAR AND CHARGE SCALING DAC TO GENERATE DIGITAL OUTPUT REPRESENTING ERROR INPUT TO ADJUST SWITCHING CONVERTER

608

ALTERNATE BETWEEN UTILIZING OFFSET VALUE, FROM OFFSET CONTROLLER, TO COUNTER OFFSET VOLTAGE IN POWER MANAGEMENT SYSTEM, AND UTILIZING OUTPUT OF SAR TO GENERATE THE DIGITAL OUTPUT

610

ADJUST A VOLTAGE RANGE, UTILIZED BY ADC TO GENERATE DIGITAL OUTPUT, BASED ON TRENDS OF DIGITAL OUTPUT

*FIG. 6*

OFFSET REDUCTION IN POWER MANAGEMENT SYSTEMS

BACKGROUND

Field

This disclosure relates generally to power management systems for integrated circuits and, more specifically, to offset reduction in power management systems.

Background Information

In a power management system, a switching converter, such as a buck, boost, or buck-boost converter, can supply power to one or more subsystems representing a load, such as a central processing unit (CPU), graphics processing unit (GPU), or system on a chip (SoC). The switching converter can provide the power through a power delivery network (PDN) which may include circuitry such as transmission lines, capacitors, etc.

To ensure the power requirements of a subsystem are met with sufficient speed, the switching converter can utilize an analog to digital converter (ADC) to receive feedback of the power delivered through the PDN. For example, the ADC can receive an error input corresponding to a difference between an output voltage of the switching converter, at an output node of the PDN, and a target voltage for the subsystem. The ADC can then generate a digital output representing the control loop error that, in turn, can be used by a power controller to adjust the switching converter to reduce the error. This can help the switching converter to quickly meet the power requirements of the subsystem which may be continuously changing over time, for example, due to software applications that may be executing.

SUMMARY

Implementations of this disclosure include utilizing an offset controller to reduce or cancel an offset error in a power management system. The offset controller can reduce or cancel the offset error by selectively charging a charge scaling digital to analog converter (also referred to as a charge scaling DAC, or simply DAC) of a successive approximation ADC (also referred to as a SAR ADC, or simply ADC) with an offset value when sampling a control loop error (e.g., an error input), then charging the DAC based on an output of a successive approximation register (SAR) of the ADC when converging on a digital output. This may enable a reduction or cancellation of the offset error when generating the digital output to improve accuracy of the output. Implementations may also utilize an error trend sensing circuit and a range controller to dynamically adjust a voltage range in which the control loop error is digitized by the ADC. This may enable higher resolution of the digital output and, in turn, more accurate control of the switching converter. In some cases, the system can simultaneously reduce or cancel the offset error while dynamically adjusting the voltage range.

Some implementations may include a power management system including circuitry, such as a switching converter, a successive approximation ADC, an offset controller, and/or a range controller. The switching converter can provide an output voltage for a subsystem such as an SoC. The successive approximation ADC can receive an error input based on a difference between the output voltage and a target voltage for the subsystem. The ADC can utilize a successive approximation register (SAR) and a charge scaling digital to analog converter (DAC) to generate a digital output, representing the error input, to adjust the switching converter. The offset controller can provide an offset value to the ADC to counter an offset error in the power management system. The ADC can alternate between utilizing the offset value and utilizing an output of the SAR to generate the digital output. Further, a range controller can adjust a voltage range, utilized by the ADC to generate the digital output, based on the error input. Other aspects are also described and claimed.

The above summary does not include an exhaustive list of all aspects of the present disclosure. It is contemplated that the disclosure includes all systems and methods that can be practiced from all suitable combinations of the various aspects summarized above, as well as those disclosed in the Detailed Description below and particularly pointed out in the Claims section. Such combinations may have particular advantages not specifically recited in the above summary.

BRIEF DESCRIPTION OF THE DRAWINGS

Several aspects of the disclosure here are illustrated by way of example and not by way of limitation in the figures of the accompanying drawings in which like references indicate similar elements. It should be noted that references to "an" or "one" aspect in this disclosure are not necessarily to the same aspect, and they mean at least one. Also, in the interest of conciseness and reducing the total number of figures, a given figure may be used to illustrate the features of more than one aspect of the disclosure, and not all elements in the figure may be required for a given aspect.

FIG. 6 is a flowchart of an example of a process for offset reduction in power management systems.

DETAILED DESCRIPTION

Figure 1:
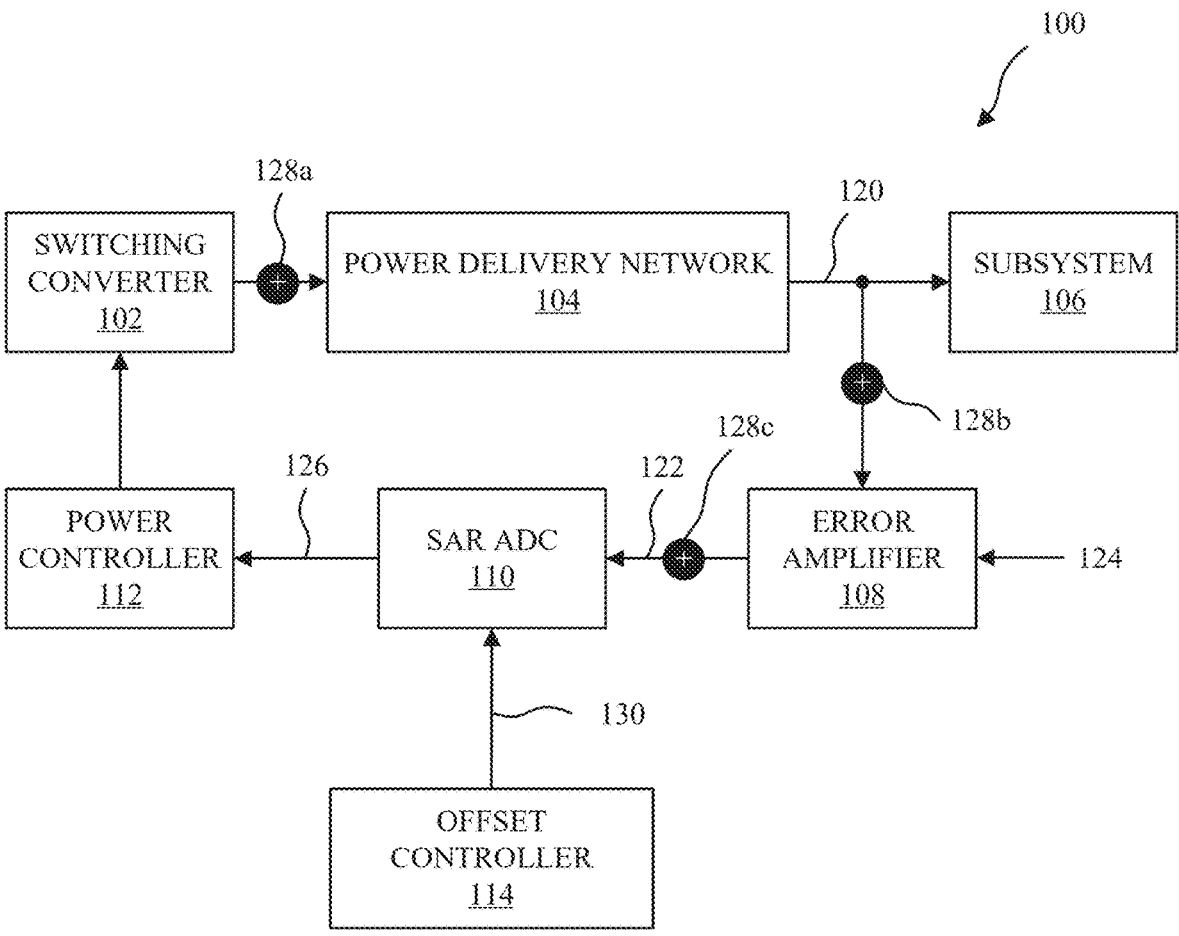
FIG. 1 is an example of a power management system with offset reduction.

Integrated circuits (ICs), such as CPUs, GPUs, and SoCs, continue to get smaller in size, while operating with reduced power, based on improved manufacturing processes. They also continue to execute more complex, load-intensive software applications that may be developed. As a result, many ICs demand power with reduced tolerances or margins while experiencing heavy fluctuations on power supply rails (e.g., different load current and voltage transients), thereby complicating power supply regulation. Further complicating this, many systems include imperfections, such as physical property mismatches of electrical components, and/or changes in operating behavior with temperature. This may result in offset errors occurring at various points in the system, such as voltage difference between points where voltages should ideally be the same. These offset errors can skew feedback to switching converters which, in turn, can skew the power supply regulation to the CPU, GPU, or SoC.

Implementations of this disclosure may address problems such as these by utilizing an offset controller to reduce or cancel an offset error in a power management system. The offset controller can reduce or cancel the offset error by selectively charging a charge scaling DAC of a successive approximation ADC with an offset value when sampling a control loop error (e.g., an error input), then charging the DAC based on an output of a SAR of the ADC when converging on a digital output. This may enable a reduction or cancellation of the offset error when generating the digital output to improve accuracy of the output. Implementations may also utilize an error trend sensing circuit and a range controller to dynamically adjust a voltage range in which the control loop error is digitized by the ADC. This may enable higher resolution of the digital output and, in turn, more accurate control of the switching converter. In some cases, the system can simultaneously reduce or cancel the offset error while dynamically adjusting the voltage range.

A successive approximation ADC may refer to a type of ADC that converts an analog input into a digital output representing the analog input. The ADC may perform the conversion via a binary search through quantization levels before converging upon the digital output. The ADC may be a charge redistribution ADC that includes a sample and hold circuit, an analog voltage comparator, a charge scaling DAC, and a SAR. The sample and hold circuit may receive an analog input voltage, such as the error input. The comparator can compare the input voltage to the output of the DAC and generate an output of the result. The SAR may receive the result from the comparator and provide an approximate digital value (a candidate value) of the input voltage to the DAC. The DAC may compare the digital value with a reference voltage (VREF) and provide the comparator with an analog voltage equal to the digital value output from the SAR. For example, the DAC may utilize an array of individually switched binary-weighted capacitors. The amount of charge upon each capacitor in the array may be used to perform the binary search to generate the digital output, in conjunction with a comparator of the DAC.

Some implementations may include a power management system including circuitry, such as a switching converter (e.g., a buck, boost, or buck-boost converter), a successive approximation ADC, an offset controller, and/or a range controller. The switching converter can provide an output voltage for a subsystem (e.g., a CPU, GPU, or SoC). The successive approximation ADC can receive an error input based on a difference between the output voltage and a target voltage for the subsystem (a control loop error). The ADC can utilize a SAR and a charge scaling DAC (e.g., capacitive or resistive charge scaling) to generate a digital output representing the error input, such as a plurality of bits digitizing the error input (e.g., 7 bits). A power controller may then use the digital output to adjust the switching converter. The offset controller can provide an offset value to the ADC to counter an offset error in the power management system. The offset error may be due to a physical property mismatch of electrical components and/or a temperature change. The offset value may be a cumulation of multiple offset values to counter a cumulation of multiple offset errors in the system. The ADC can alternate between utilizing the offset value and utilizing an output of the SAR to generate the digital output. The range controller can adjust a voltage range, utilized by the ADC to generate the digital output, based on the error input. As a result, the offset error may be reduced or cancelled when generating the digital output, which may be generated with higher resolution, each of which improving accuracy.

In some implementations, the system may enable fast load tracking, offset cancellation, and dynamic range reduction via input tracking of the SAR ADC used for power delivery to the subsystem. The system can control load line regulation of the switching converter by using the ADC to sense the output voltage and load transient and adjust the mode/switching of the switching converter accordingly. The system may utilize capacitive-based successive approximation registers (as Cap-SAR ADC) to sense the load line regulation error (control loop error). The SAR ADC may enable low power and high efficiency for power applications. The power applications may include noisy environments which may typically involve a high dynamic range to control the different load profiles of the subsystem. For example, the noisy environments may be due to a high dynamic nature of the system loads as well as coupling from other subsystems sources. The system may reduce or cancel offset errors of the ADC and/or the power control loop to improve stability and accuracy of the power delivery. The system can increase the dynamic range of the ADC and reduce the offset errors, without increasing complexity of the design and the power consumption (e.g., without adding more bits to digitize the error input), by reducing offset and dynamic range requirements for the SAR. This may result in a reduction of power consumption of the switching converter and corresponding enhancement of system efficiency.

The ADC operation may have two phases: a sample phase in which the ADC samples the error input (an analog signal), and a conversion phase in which the ADC converges the error input into a digital output (e.g., a digital equivalent comprised of a plurality of bits). The circuitry described herein can change the sample phase by utilizing pre-set control signals (corresponding to an offset value) to adjust a DAC controller to reduce or cancel an offset error in the power control loop when sampling the error input (offset reduction and sampling actions being performed at the same time). The power control loop can reduce or cancel the offset error by controlling the charge scaling DAC to redistribute charge to affect the reduction or cancellation of the offset error. This may enable real-time temperature and mode-based offset error reduction or cancellation of the power control loop using the ADC. Moreover, the system may enable offset error reduction or cancellation for each sample without adversely affecting power or timing. This may enable real-time tracking of drifts across temperatures and modes of operation.

Further, the switching converter operation may involve a high dynamic range and small precision and accuracy. This may result in the ADC having to utilize many bits for the digital conversion; increasing the number of bits comes at a cost of significantly increasing power consumption. As disclosed herein, the high sampling rate of the ADC enables the early detection of voltage droops and trends of control loop errors. The system may utilize this to detect with precision the control loop error and adjust the dynamic range of the ADC accordingly, such as by shifting the dynamic range in real time based on the error input to adjust the ADC conversion window to the error input. The system may utilize the same charge scaling DAC to implement the dynamic range shift to reduce digital error computations. This may enable a reduction of the number of bits used by the SAR to generate the digital output, thereby simplifying the design.

FIG. 1 is an example of a power management system 100 with offset reduction. The system 100 may be a first example of a power management unit (PMU). The system 100 may include a switching converter 102, a PDN 104, a subsystem 106, an error amplifier 108, a successive approximation ADC 110, a power controller 112, and an offset controller 114, in a power control loop. The switching converter 102 could be a buck, boost, or buck-boost converter configured to provide an output voltage 120 (and output current) to the subsystem 106. The subsystem 106 could be, for example, a CPU, GPU, or SoC. Thus, the switching converter 102 supplies power to the subsystem 106, which represents a load in the system 100. The switching converter 102 provides the power through the PDN 104, which may include circuitry such as transmission lines, capacitors, etc.

To meet the power requirements of the subsystem 106, the switching converter 102 can utilize the ADC 110 to receive feedback of the power delivered through the PDN 104. For example, the error amplifier 108 can receive the output voltage 120 at an output node of the PDN 104 coupled with the subsystem 106, sensing a power supply rail for the subsystem 106. The error amplifier 108, in turn, can generate an error input 122 to the ADC 110 representing a control loop error. The error input 122 may correspond to a difference between the output voltage 120 of the switching converter 102, e.g., at the output node of the PDN 104, and a target voltage 124 for the subsystem 106. The target voltage 124 may represent a target for the switching converter 102 to achieve optimum operation of the subsystem 106. The ADC 110, in turn, can generate a digital output 126 to digitally represent the control loop error (e.g., a plurality of bits, such as 7 bits). The power controller 112, in turn, can utilize the digital output 126 to adjust the switching converter 102 to reduce the control loop error. This feedback loop can help the switching converter 102 to continuously meet the power requirements of the subsystem 106.

The subsystem 106 may be a small size, and may operate with reduced power, based on an improved manufacturing process. This may result in a reduced tolerance or margin that may be acceptable for the output voltage 120. The subsystem 106 may also execute complex, load-intensive software applications, which may result in heavy fluctuations at the output node. Further, the system 100 may have imperfections, such as physical property mismatches of electrical components, and/or changes in operating behavior with temperature. This may result in offset errors occurring at various points in the system. An offset error may indicate a voltage difference between points in the system 100 where voltages should be the same. For example, the system 100 may include offset error 128a at the switching converter 102 (e.g., due to physical property mismatches between power components and/or temperature changes caused by power delivery), offset error 128b at the output node of the PDN 104 (e.g., due to temperature changes caused by load variations in the power supply regulation), and/or offset error 128c at the ADC 110 (e.g., due to physical property mismatches between individually switched binary-weighted capacitors in a charge scaling array). These offset errors may be cumulative, and if uncorrected, could skew feedback to the switching converter 102 (e.g., the digital output 126) which, in turn, could skew power supplied to the subsystem 106.

Implementations of this disclosure may address problems such as these by utilizing the offset controller 114 to reduce one or more offset errors in the system 100, such as offset errors 128a, 128b, and/or 128c. The offset controller 114 can selectively charge a charge scaling DAC of the ADC 110 with an offset value 130 when sampling the error input 122, then charge the DAC based on an output of a SAR of the ADC 110 when converging on the digital output 126. The offset value 130 may be a cumulation of multiple offset values to counter a cumulation of multiple offset errors in the system 100, such as offset errors 128a, 128b, and/or 128c.

The offset controller 114 supplying the offset value 130, and the ADC 110 utilizing the offset value 130, may enable a reduction or cancellation of the one or more offset errors when generating the digital output 126.

Figure 2:
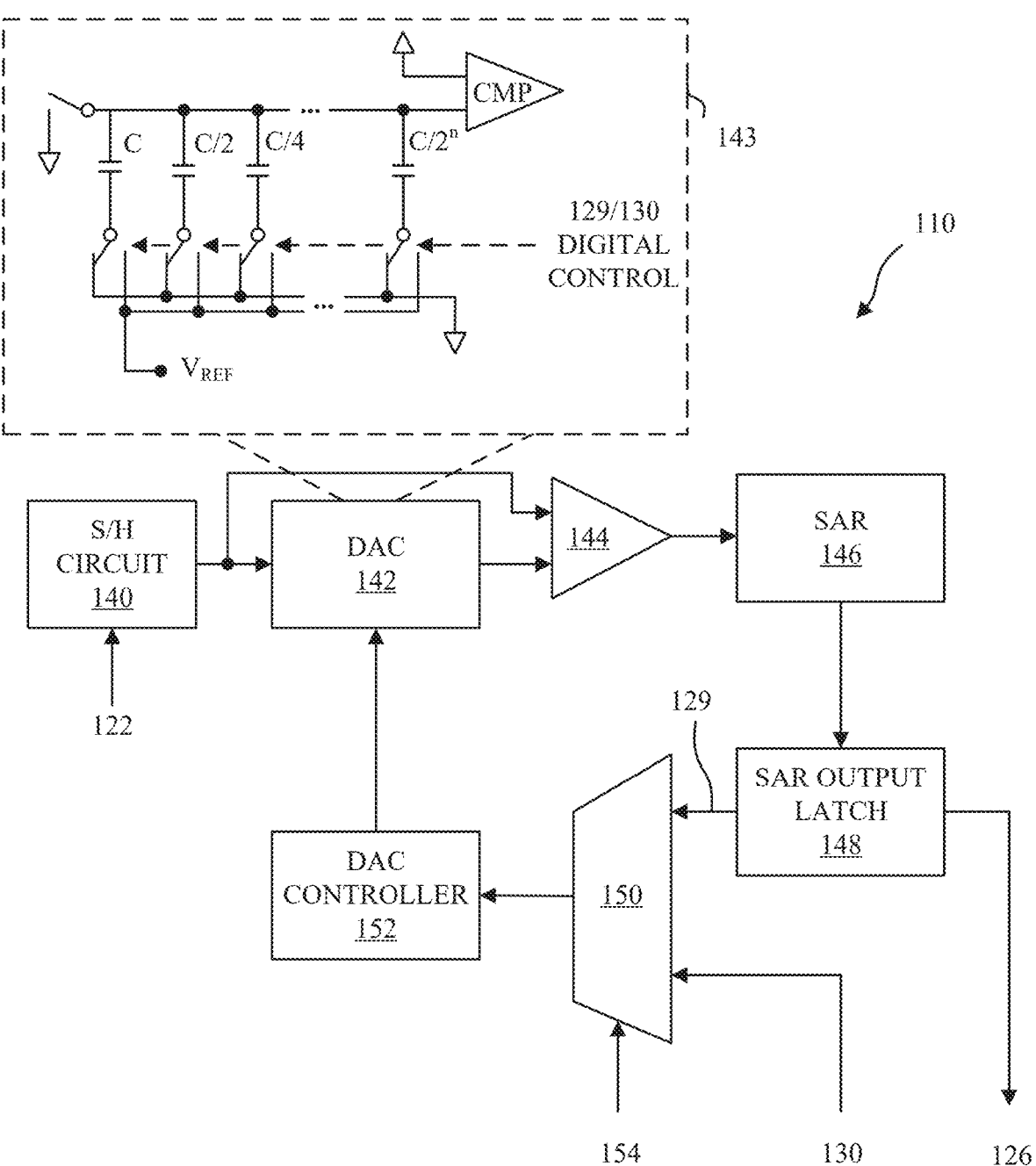
FIG. 2 is an example of an ADC providing offset reduction.

By way of example, with additional reference to FIG. 2, the ADC 110 may include a sample and hold circuit 140, a charge scaling DAC 142 (or simply DAC), an analog voltage comparator 144, a SAR 146, a SAR output latch 148, a selector 150, and a DAC controller 152. The sample and hold circuit 140 may include, for example, switches and/or latches to sample and hold the error input 122. In a sample phase of the ADC 110, the sample and hold circuit 140 can capture the error input 122 from the error amplifier 108, representing the control loop error at a given time. The sample and hold circuit 140, in turn, may provide the error input 122 to the DAC 142 and the comparator 144.

In a conversion phase of the ADC 110, the DAC 142 can adjust charges (capacitive or resistive) to generate an output to the comparator 144. For example, as shown in a detailed view 143, the DAC 142 could adjust charges in an array of individually switched binary-weighted capacitors (which could also have physical property mismatches between them, resulting in the offset error 128c). The amount of charge upon each capacitor in the array may be used to perform a binary search in conjunction with a comparator ("CMP") of the DAC 142. Then, the comparator 144 will compare the error input 122 to the output from the DAC 142 to generate an output to the SAR 146. The SAR 146, in turn, can digitize the output from the comparator 144 to generate a digital output 129, which may include a plurality of bits corresponding to an approximate digital value representing the error input 122 (e.g., a candidate for the digital output 126). The digital output 129 may be latched by the SAR output latch 148, which may include switches and/or latches to sample and hold the digital output 129. The DAC 142 may compare the digital output 129 with a reference voltage (VREF) and provide the comparator 144 with an analog voltage equal to the digital value output from the SAR 146. For example, the DAC 142 may adjust charges of the array of individually switched binary-weighted capacitors shown in the detailed view 143. The amount of charge upon each capacitor in the array may be adjusted through multiple cycles of the loop to perform the binary search and generate the digital output 126.

To reduce one or more offset errors in the system 100, the offset controller 114 can provide an offset value 130 to the ADC 110 to counter the one or more offset errors in the system 100, such as offset errors 128a, 128b, and/or 128c. For example, the offset controller 114 could couple a negative voltage to the ADC 110 (and the DAC 142 as discussed herein) to counter a positive voltage corresponding to offset errors 128a, 128b, and/or 128c. The positive voltage (e.g., the offset error) may be reduced or canceled when the error input 122 is sampled, without interference of the ADC 110 operation.

The ADC 110 can alternate between utilizing the offset value 130 and utilizing the digital output 129 of the SAR 146 to generate the digital output 126. A selection signal 154, controlling the selector 150, may be controlled by a state machine of the ADC 110. In a first state corresponding to a sample phase, the selection signal 154 can select the offset value 130 to transmit to the DAC controller 152. The DAC controller 152, in turn, can adjust charges of the DAC 142 based on the offset value 130. For example, the DAC controller 152 can adjust charges in the array of individually switched binary-weighted capacitors based on the offset value 130. This can occur while the sample and hold circuit 140 receives and holds the error input 122 from the error amplifier 108. Then, in a second state corresponding to the conversion phase, the selection signal 154 can select the digital output 129 to transmit to the DAC controller 152. The DAC controller 152, in turn, can adjust charges of the DAC 142 based on selections of the individually switched binary-weighted capacitors in the loop, converging on the error input 122 to generate the digital output 126 latched by the SAR output latch 148. In some cases, the offset value 130 may be applied in each cycle of the loop, canceling the offset error for each candidate for the digital output 126. As a result, the offset controller 114 can skew the ADC 110 by the offset value 130 when generating the digital output 126, thereby reducing or cancelling the offset error (e.g., offset errors 128a, 128b, and/or 128c). The offset controller 114 can counter the offset error in real time, with operation of the ADC 110 generating the digital output 126, without taking the ADC 110 offline.

Thus, the ADC 110 can switch back and forth between the digital output 129 of the SAR 146 and the offset value 130 from the offset controller 114, so that it can reprogram the DAC 142 to reduce or cancel the offset error. The ADC 110 may utilize pre-set control signals (the offset value 130) to adjust the DAC controller 152 to reduce or cancel the offset error in the power control loop when sampling the error input 122 (actions performed at the same time). The power control loop can reduce or cancel the offset error by controlling charge scaling of the DAC 142 to redistribute charge to affect the reduction or cancellation. This may enable real-time temperature and mode-based offset error reduction or cancellation of the power control loop using the ADC 110. Moreover, this may enable offset error reduction or cancellation for each sample without adversely affecting power or timing to enable real-time tracking of drifts across temperatures and modes of operation.

In some implementations, a controller (e.g., the offset controller 114) can determine an offset error in the system 100, such as offset errors 128a, 128b, and 128c, based on determining property mismatches and/or sensing in the system 100. Further, the offset error determined may be a cumulation of multiple offset errors in the system. For example, the controller can include a processor or SoC configured to execute instructions stored in memory. The controller can access a data structure storing property mismatch information associated with one or more offset errors, such as offset errors 128a, 128b, and/or 128c, and/or receive sensing via sensors at points associated with the one or more offset errors. The sensing may be performed by different sensors in the system, such as one or more temperature sensors, voltage sensors, or combination thereof. For example, the system may include temperature sensors at points associated with the offset errors 128a, 128b, and 128c, and a voltage sensor at a point associated the switching converter 102 (the main supply), to determine the offset error. The controller can determine the offset error based on the mismatch information and/or the sensing. The controller can then determine the offset value 130 to counter the offset error that is determined (the offset value 130 that is determined may be a cumulation of multiple offset values to counter multiple offset errors). For example, the controller can determine an offset error representing a collection of multiple offset errors in the system 100 (e.g., offset errors 128a, 128b, and 128c), then determine an offset value (e.g., the offset value 130) to counter the multiple offset errors. This may result in an effective offset cancellation in the system. Further, the offset errors and/or offset values may be stored in the data structure to track process, voltage, and/or temperature variations in the system, including to generate statistics and/or refine the determinations.

Implementations of this disclosure may also utilize an error trend sensing circuit and a range controller to dynamically adjust a voltage range in which the error input 122 (control loop error) is digitized by the ADC 110. This may enable higher resolution of the digital output 126 and, in turn, more accurate control of the switching converter 102. In some cases, the system 100 can simultaneously reduce or cancel the offset error (e.g., offset errors 128a, 128b, and/or 128c) while dynamically adjusting the voltage range.

Figure 3:
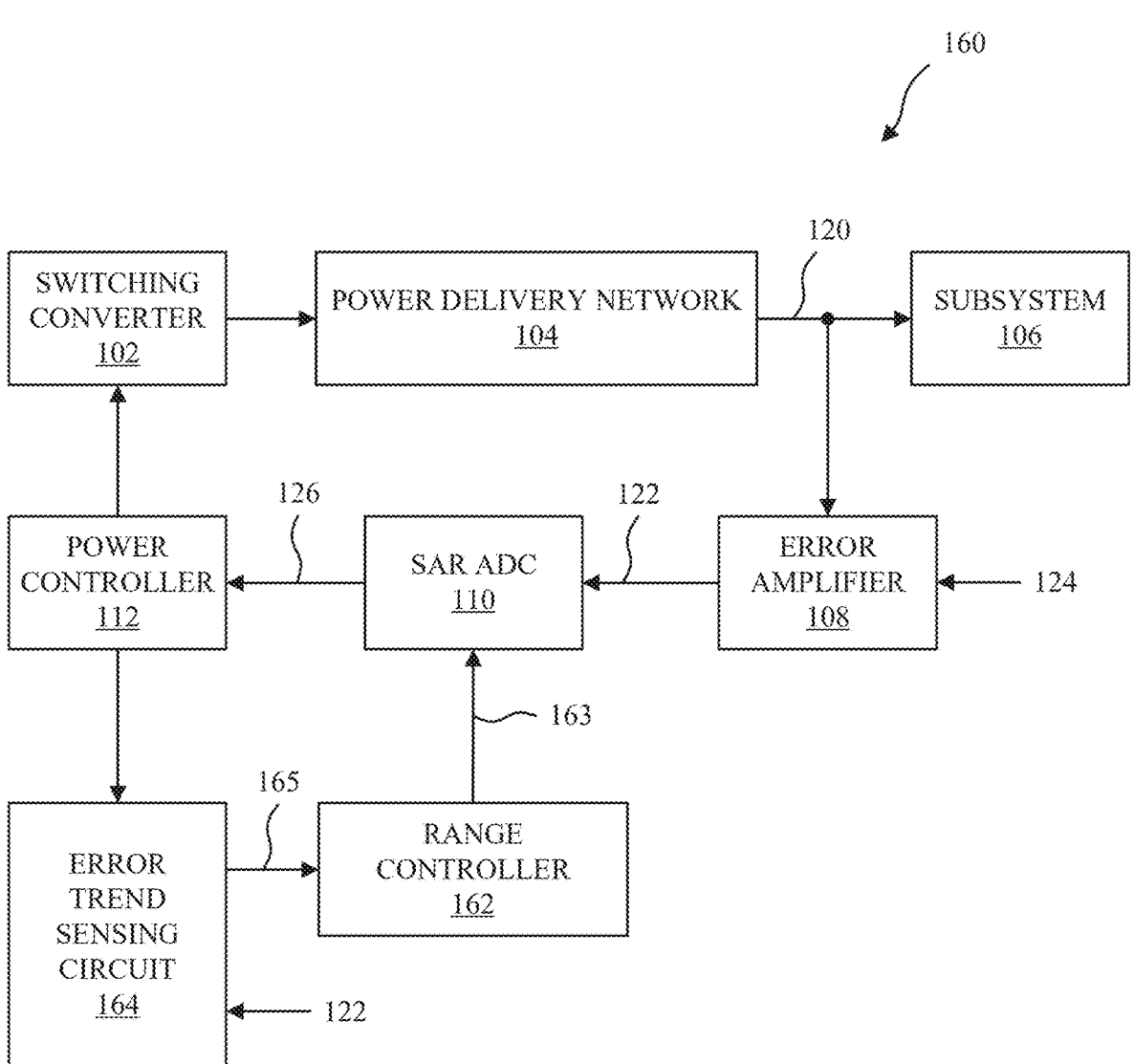
FIG. 3 is an example of a power management system with range adjustment.

By way of example, with additional reference to FIG. 3, a power management system 160 may include the switching converter 102, the PDN 104, the subsystem 106, the error amplifier 108, the successive approximation ADC 110, and the power controller 112, in a power control loop. The system 160 may be another example of a PMU. In some cases, the system 160 may also include the offset controller 114 of the system 100. In addition, the system 160 may include a range controller 162 and an error trend sensing circuit 164.

Figure 4:
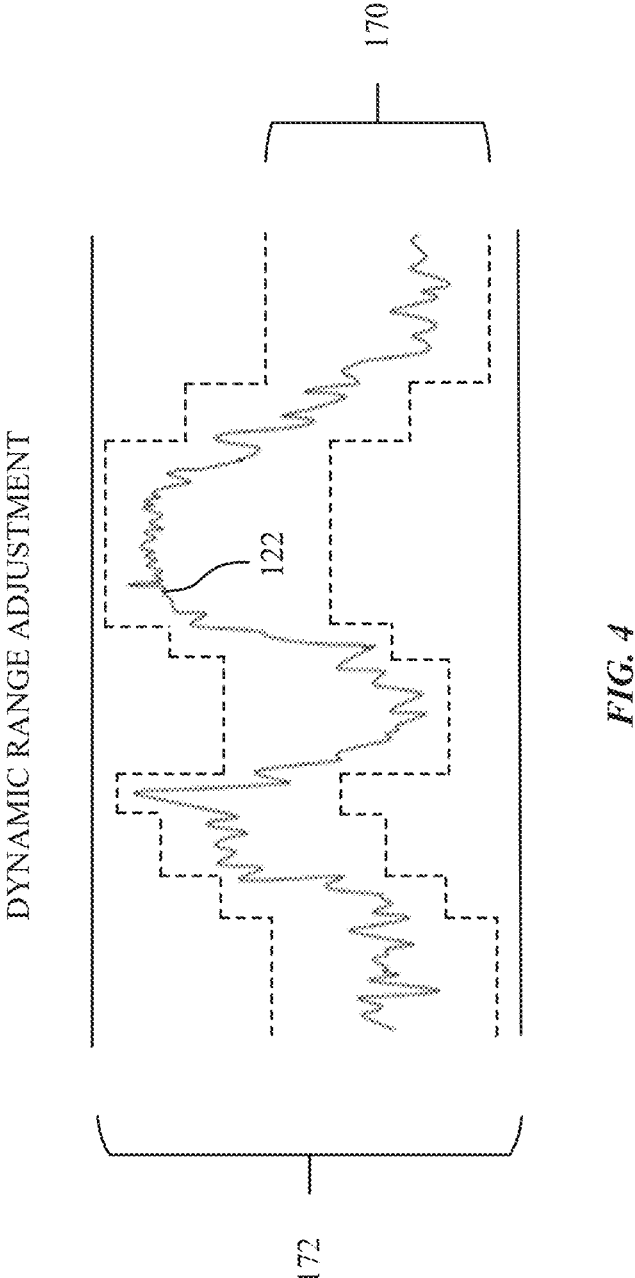
FIG. 4 is an example of range adjustment based on error input.

With additional reference to FIG. 4, the range controller 162 can adjust, during an operation to generate the digital output 126, a dynamic voltage range 170 utilized by the ADC 110 to digitize the error input 122 (an ADC conversion window). The range controller 162 can cause the ADC 110 to adjust the voltage range 170 via a range control signal 163. The voltage range 170 may represent a reduction or narrowing of a high dynamic range 172 that may be normally utilized by the ADC 110 to digitize the error input 122. For example, the high dynamic range 172 may include a minimum voltage and a maximum voltage in which the ADC 110 can sense to generate the plurality of bits digitizing the error input 122. The voltage range 170 may be adjusted by the range controller 162 based on trends 165 of the error input 122 that are determined by the error trend sensing circuit 164. The error trend sensing circuit 164 can track the output of the ADC 110 (e.g., the digital output 126) for adjusting the voltage range 170.

The voltage range 170 may be adjusted to increase resolution of the digital output 126 utilized by the ADC 110, such as by causing the plurality of bits to be digitized between an upper limit and a lower limit within the minimum voltage and the maximum voltage. The range controller 162 can cause adjustment of the voltage range 170, dynamically, on the fly during operation of the ADC 110, through the loop described above with respect to FIG. 2. For example, the range controller 162 can cause further adjusting of charges of the DAC 142 (e.g., the array of individually switched binary-weighted capacitors shown in the detailed view 143) based on the trends 165. The range controller 162 can cause charges of the capacitors to shift the voltage range 170 to track the error input 122 (e.g., shifting the ADC conversion window). The error trend sensing circuit 164 can track the error input 122, and the output of the ADC 110 (e.g., the digital output 126), to determine whether the error input 122 is trending higher or lower. Trending higher may cause the range controller 162 to control the ADC 110 to move the voltage range 170 higher to track the error input 122. Trending lower may cause the range controller 162 to control the ADC 110 to move the voltage range 170 lower to track the error input 122.

A high sampling rate of the ADC 110 may enable early detection of voltage droops and trends of control loop errors by the error trend sensing circuit 164. The error trend sensing circuit 164 may utilize this to detect with precision the control loop error to enable the range controller 162, in turn, to cause adjustment of the voltage range 170 via the ADC 110. The ADC 110 can then be controlled to shift the dynamic range in real time based on the error input 122 to adjust the ADC conversion window. In some cases, the range controller 162 can cause the ADC 110 to subtract an amount from the error input 122 when the error input 122 is closer to an upper limit of the voltage range 170, and to add another amount to the error input 122 when the error input 122 is closer to a lower limit of the voltage range 170. This may enable simplified shifting of the dynamic range in real time. The system may utilize the charge scaling DAC 142 (FIG. 2) to implement the dynamic range shift to reduce digital error computations. This may enable a reduction of the number of bits used by the ADC 110, including the SAR 146, to generate the digital output 126, thereby reducing noise requirements and simplifying the design.

Figure 5:
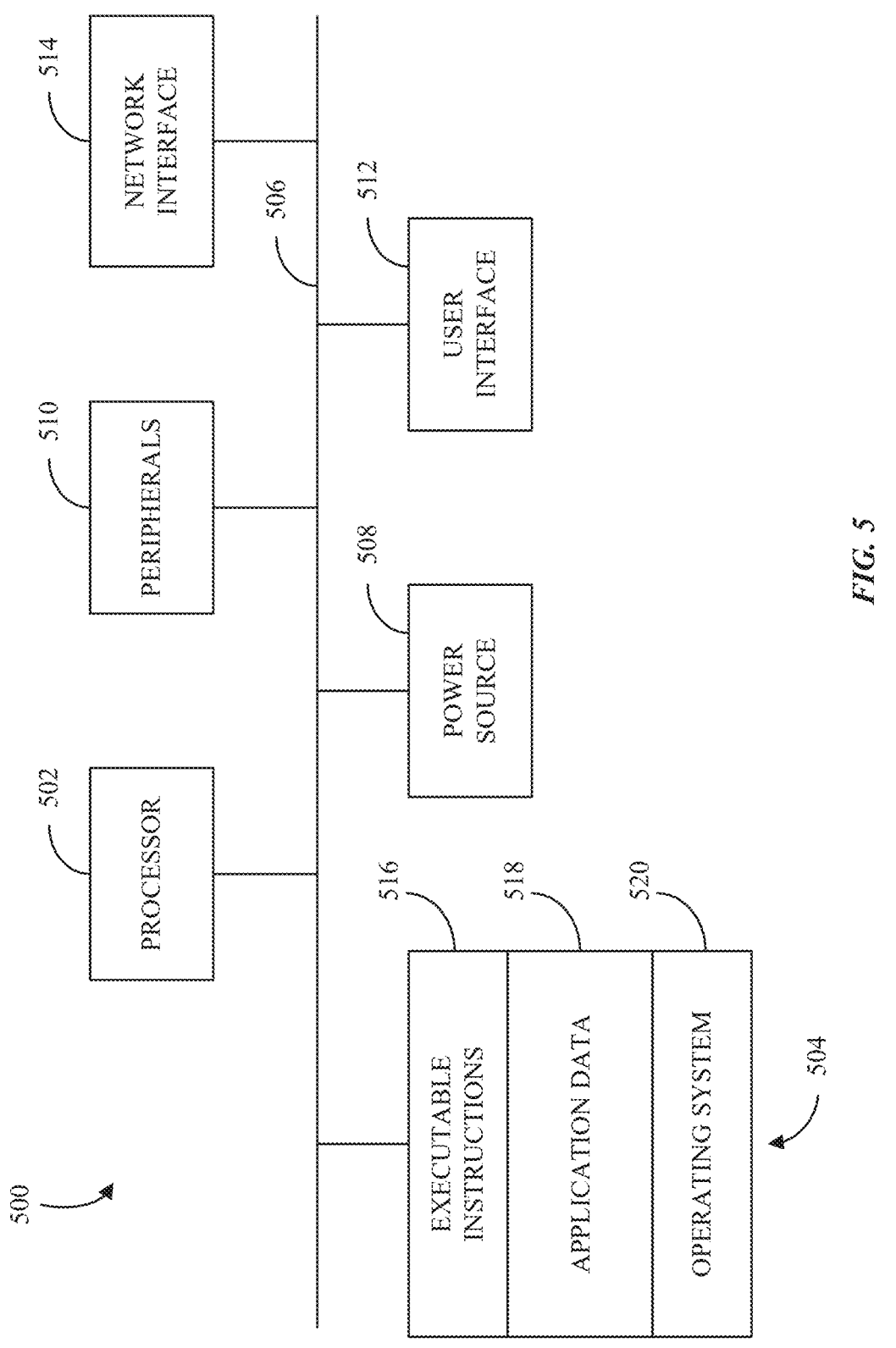
FIG. 5 is a block diagram of an example internal configuration of a computing device for offset reduction in power management systems.

FIG. 5 is a block diagram of an example internal configuration of a computing device 500 for offset reduction and/or range adjustment in power management systems. For example, the computing device 500 could provide the aforementioned control in the system 100 or the system 160 (e.g., the offset controller 114, the range controller 162, and/or the error trend sensing circuit 164). The computing device 500 includes components or units, such as a processor 502, a memory 504, a bus 506, a power source 508, peripherals 510, a user interface 512, a network interface 514, other suitable components, or a combination thereof. One or more of the memory 504, the power source 508, the peripherals 510, the user interface 512, or the network interface 514 can communicate with the processor 502 via the bus 506.

The processor 502 is a central processing unit, such as a microprocessor, and can include single or multiple processors having single or multiple processing cores. Alternatively, the processor 502 can include another type of device, or multiple devices, configured for manipulating or processing information. For example, the processor 502 can include multiple processors interconnected in one or more manners, including hardwired or networked. The operations of the processor 502 can be distributed across multiple devices or units that can be coupled directly or across a local area or other suitable type of network. The processor 502 can include a cache, or cache memory, for local storage of operating data or instructions.

The memory 504 includes one or more memory components, which may each be volatile memory or non-volatile memory. For example, the volatile memory can be random access memory (RAM) (e.g., a DRAM module, such as dual data rate (DDR) DRAM). In another example, the non-volatile memory of the memory 504 can be a disk drive, a solid state drive, flash memory, or phase-change memory. In some implementations, the memory 504 can be distributed across multiple devices. For example, the memory 504 can include network-based memory or memory in multiple clients or servers performing the operations of those multiple devices.

The memory 504 can include data for immediate access by the processor 502. For example, the memory 504 can include executable instructions 516, application data 518, and an operating system 520. The executable instructions 516 can include one or more application programs, which can be loaded or copied, in whole or in part, from non-volatile memory to volatile memory to be executed by the processor 502. For example, the executable instructions 516 can include instructions for performing some or all the techniques of this disclosure. The application data 518 can include user data, database data (e.g., database catalogs or dictionaries), or the like. In some implementations, the application data 518 can include functional programs, such as a web browser, a web server, a database server, another program, or a combination thereof. The operating system 520 can be, for example, any known personal or enterprise operating system; an operating system for a mobile device, such as a smartphone or tablet device; or an operating system for a non-mobile device, such as a mainframe computer.

The power source 508 provides power to the computing device 500. For example, the power source 508 can be an interface to an external power distribution system. In another example, the power source 508 can be a battery, such as where the computing device 500 is a mobile device or is otherwise configured to operate independently of an external power distribution system. In some implementations, the computing device 500 may include or otherwise use multiple power sources. In some such implementations, the power source 508 can be a backup battery.

The peripherals 510 includes one or more sensors, detectors, or other devices configured for monitoring the computing device 500 or the environment around the computing device 500. For example, the peripherals 510 can include a geolocation component, such as a global positioning system location unit. In another example, the peripherals can include a temperature sensor for measuring temperatures of components of the computing device 500, such as the processor 502. In some implementations, the computing device 500 can omit the peripherals 510.

The user interface 512 includes one or more input interfaces and/or output interfaces. An input interface may, for example, be a positional input device, such as a mouse, touchpad, touchscreen, or the like; a keyboard; or another suitable human or machine interface device. An output interface may, for example, be a display, such as a liquid crystal display, a cathode-ray tube, a light emitting diode display, virtual reality display, or other suitable display.

The network interface 514 provides a connection or link to a network. The network interface 514 can be a wired network interface or a wireless network interface. The computing device 500 can communicate with other devices via the network interface 514 using one or more network protocols, such as using Ethernet, transmission control protocol (TCP), internet protocol (IP), power line communication, an IEEE 802.X protocol (e.g., Wi-Fi, Bluetooth, or ZigBee), infrared, visible light, general packet radio service (GPRS), global system for mobile communications (GSM), code-division multiple access (CDMA), Z-Wave, another protocol, or a combination thereof.

FIG. 6 is a flowchart of an example of a process 600 for offset reduction and/or range adjustment in power management systems. The process 600 can be executed using computing devices, such as the systems, hardware, and software described with respect to FIGS. 1-5. The process 600 can be performed, for example, by executing a machine-readable program or other computer-executable instructions, such as routines, instructions, programs, or other code. The steps, or operations, of the process 600 or another process, method, technique, or algorithm described in connection with the implementations disclosed herein can be implemented directly in hardware, firmware, software executed by hardware, circuitry, or a combination thereof.

For simplicity of explanation, the process 600 is depicted and described herein as a series of steps or operations. However, the steps or operations in accordance with this disclosure can occur in various orders and/or concurrently. Additionally, other steps or operations not presented and described herein may be used. Furthermore, not all illustrated steps or operations may be required to implement a process in accordance with the disclosed subject matter.

At operation 602, a power management system may determine an offset value in the system. For example, a controller in the system 100 (e.g., the offset controller 114) may determine the offset value 130 to counter an offset error, such as one or more of offset errors 128*a*, 128*b*, and/or 128*c*. The controller may determine the offset error based on evaluating mismatches of physical properties at different points in system 100, and/or based on sensing in the system 100, such as temperature sensing at points associated with the offset errors 128*a*, 128*b*, and/or 128*c*.

At operation 604, the system may utilize a switching converter to provide an output voltage for a subsystem. For example, the system may utilize the switching converter 102, which could be a buck, boost, or buck-boost converter, to provide the output voltage 120 (and output current) for the subsystem 106 which could be a CPU, GPU, or SoC. The switching converter 102 can supply power to the subsystem 106, which may represent a load in the system. The switching converter 102 may provide the output voltage through the PDN 104, which may include transmission lines, capacitors, etc.

At operation 606, the system may utilize a successive approximation ADC to receive an error input based on a difference between the output voltage and a target voltage for the subsystem. The ADC may utilize a SAR and a charge scaling DAC to generate a digital output representing the error input to adjust the switching converter. For example, the system 100 may utilize the ADC 110 to receive the error input 122, which input may be based on a difference between the output voltage 120 and the target voltage 124 for the subsystem 106 (e.g., a control loop error). The ADC 110 may utilize the SAR 146 and the DAC 142 to generate the digital output 126, representing the error input 122 in digital form, to adjust the switching converter 102.

At operation 608, the system may alternate between utilizing the offset value, from the offset controller, to counter the offset error in the system, and utilizing an output of the SAR, to generate the digital output. For example, the ADC 110 may alternate between utilizing the offset value 130, from the offset controller 114, to counter one or more of the offset errors 128*a*, 128*b*, and/or 128*c*, and utilizing the digital output 129 of the SAR 146, to generate the digital output 126. The ADC 110 can charge the charge scaling DAC 142 with the offset value 130 when sampling the error input 122, then charge the DAC 142 based on the digital output 129 of the SAR 146 when converging on the digital output 126. This may enable a reduction or cancellation of the offset error when generating the digital output 126.

At operation 610, the system may utilize a range controller to adjust a voltage range, utilized by the ADC to generate the digital output, based on trends of the error input. For example, the system 160 may utilize the range controller 162 (in addition to utilizing the offset controller 114, or instead of utilizing the offset controller 114, as the case may be) to adjust the voltage range 170, utilized by the ADC 110 to generate the digital output 126, based on trends of the error input 122. The error trend sensing circuit 164 may determine the trends based on tracking the error input 122 and the output of the ADC 110 (e.g., the digital output 126). In some cases, the system can simultaneously reduce or cancel the offset error (e.g., offset errors 128*a*, 128*b*, and/or 128*c*) while adjusting the voltage range (e.g., voltage range 170).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

In utilizing the various aspects of the embodiments, it would become apparent to one skilled in the art that combinations or variations of the above embodiments are possible for offset reduction and range adjustment in power management systems. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A power management system, comprising:
   a switching converter that provides an output voltage for a subsystem;
   a successive approximation analog to digital converter (ADC) that receives an error input based on a difference between the output voltage and a target voltage for the subsystem, wherein the ADC utilizes a successive approximation register (SAR) and a charge scaling digital to analog converter (DAC) to generate a digital output, representing the error input, to adjust the switching converter; and
   an offset controller that provides an offset value to the ADC to counter an offset error in the power management system, wherein the ADC alternates between utilizing the offset value and utilizing an output of the SAR to generate the digital output.

2. The power management system of claim 1, wherein the ADC utilizes the offset value to charge the DAC when sampling the error input.

3. The power management system of claim 1, wherein the ADC utilizes the output of the SAR to charge the DAC when converging on the digital output.

4. The power management system of claim 1, wherein the offset controller skews the ADC by the offset value.

5. The power management system of claim 1, wherein the offset controller couples a negative voltage to the DAC to counter a positive voltage corresponding to the offset error.

6. The power management system of claim 1, wherein the offset controller counters the offset error in real time with operation of the ADC generating the digital output without taking the ADC offline.

7. The power management system of claim 1, wherein the offset error is caused by a physical property mismatch in the power management system.

8. The power management system of claim 1, wherein the offset error is caused by a temperature change in the power management system.

9. The power management system of claim 1, further comprising:
   a controller to determine the offset error based on sensing in the power management system.

10. The power management system of claim 1, further comprising:
    a controller to determine the offset error based on evaluating a plurality of offset errors at different points in the power management system.

11. The power management system of claim 1, further comprising:

a range controller that adjusts a voltage range, utilized by the ADC to generate the digital output, based on trends of the error input.

12. The power management system of claim 11, wherein the ADC increases resolution of the digital output by reducing the voltage range.

13. The power management system of claim 11, wherein the range controller adjusts the voltage range by charging the DAC.

14. The power management system of claim 11, wherein the range controller utilizes an error trend sensing circuit to track an output of the ADC for adjusting the voltage range.

15. The power management system of claim 11, wherein the range controller subtracts an amount from the error input when closer to an upper limit and adds another amount to the error input when closer to a lower limit.

16. A method for power management, comprising:

providing, by a switching converter, an output voltage for a subsystem;

receiving, by a successive approximation analog to digital converter (ADC), an error input based on a difference between the output voltage and a target voltage for the subsystem, wherein the ADC utilizes a successive approximation register (SAR) and a charge scaling digital to analog converter (DAC) to generate a digital output, representing the error input to adjust the switching converter; and alternating, by the ADC, between utilizing an offset value from an offset controller to counter an offset error in a power management system, and utilizing an output of the SAR, to generate the digital output.

17. The method of claim 16, further comprising:

determining the offset error based on sensing a temperature in the power management system.

18. The method of claim 16, further comprising:

determining the offset error based on evaluating a plurality of offset errors caused by a mismatches of physical properties at different points in the power management system.

19. The method of claim 16, further comprising:

adjusting a voltage range, utilized by the ADC to generate the digital output, based on trends of the error input.

20. The method of claim 19, wherein the voltage range is adjusted to increase resolution of the digital output by the ADC.

* * * * *